(12) United States Patent
Young

(10) Patent No.: US 6,188,091 B1
(45) Date of Patent: Feb. 13, 2001

(54) FPGA ONE TURN ROUTING STRUCTURE USING MINIMUM DIFFUSION AREA

(75) Inventor: Steven P. Young, San Jose, CA (US)

(73) Assignee: Xilinx, Inc., San Jose, CA (US)

( * ) Notice: Under 35 U.S.C. 154(b), the term of this patent shall be extended for 0 days.

(21) Appl. No.: 09/116,292

(22) Filed: Jul. 16, 1998

Related U.S. Application Data

(62) Division of application No. 08/761,113, filed on Dec. 5, 1996, now Pat. No. 5,818,730.

(51) Int. Cl.[7] .................................................. H07L 29/40
(52) U.S. Cl. .................................................. 257/209; 257/211
(58) Field of Search .................................................. 257/208, 209, 257/202–207, 210, 211, 529

(56) References Cited

U.S. PATENT DOCUMENTS

| Re. 34,363 | | 8/1993 | Freeman | 307/465 |
|---|---|---|---|---|
| 4,484,292 | | 11/1984 | Hong et al. | 364/491 |
| 4,777,606 | | 10/1988 | Fournier | 364/491 |
| 4,933,738 | * | 6/1990 | Orbach et al. | 257/208 |
| 5,089,973 | | 2/1992 | Furtek | 364/489 |
| 5,420,447 | * | 5/1995 | Waggoner | 257/206 |
| 5,481,125 | * | 1/1996 | Harris | 257/203 |
| 5,504,439 | | 4/1996 | Tavana | 326/38 |
| 5,657,242 | | 8/1997 | Sekiyama et al. | 364/490 |
| 5,682,107 | | 10/1997 | Tavana et al. | 326/41 |
| 5,828,230 | * | 10/1998 | Young | 326/41 |
| 5,962,881 | * | 10/1999 | Young | 257/208 |
| 6,020,776 | * | 2/2000 | Young | 327/408 |
| 6,091,088 | * | 7/2000 | Arima et al. | 257/202 |

* cited by examiner

Primary Examiner—David Hardy
(74) Attorney, Agent, or Firm—Lois D. Cartier

(57) ABSTRACT

A structure and method are provided for designing the architecture of a routing structure in a programmable logic device that maximizes the number of possible paths for an available diffusion area. The method comprises steps for selecting wire directions for a plurality of wires interconnectible at a unitary diffusion area of an integrated circuit device or portion thereof. The steps of the inventive method result in a highly alternated array of wire directions, including serial sets of four wires composed of four wires extending in four compass directions. In one embodiment of the inventive method, the first two wire directions are repeated from set to set, while the second two wire directions are alternated. A second embodiment with a repeating pattern of 24 wire directions is also disclosed.

4 Claims, 7 Drawing Sheets

FPGA ONE TURN ROUTING STRUCTURE USING MINIMUM DIFFUSION AREA

CROSS-REFERENCE TO RELATED APPLICATIONS

This application is a divisional application of commonly assigned U.S. Pat. application Ser. No. 08/761,113 invented by Steven P. Young and filed Dec. 5, 1996, now issued as U.S. Pat. No. 5,818,730 on Oct. 6, 1998, which is incorporated herein by reference.

BACKGROUND OF THE INVENTION

1. Field of the Invention

The present invention relates to integrated circuits, and more specifically to a structure and method for designing the wiring layout or routing paths in a programmable logic integrated circuit device for maximizing the number of programmable connections for an available diffusion area or minimizing the diffusion area for a given number of connections.

2. Description of the Prior Art

Field programmable gate arrays (FPGAs) typically have at least two distinct programmable features. One such feature is the logic block, which typically may be programmed to assume a variety of logic functions such as some or all Boolean logic functions for a given number of inputs. The other such feature is the interconnection of such logic blocks via paths that interconnect the outputs and inputs of several logic blocks in a selected sequence to achieve a desired result. Numerous programmable routing structures have been designed to achieve various levels of choice in routing signal paths through a programmable device. U.S. Reissue Pat. No. Re. 34,363, which is incorporated herein by reference and title to which is held by the assignee hereof, discloses a programmable routing structure in the first FPGA.

Such prior art programmable routing structures typically consist of wires programmably connectable by a dispersed number of switching devices such as field effect transistors, the selected conditions of which (i.e., open or closed) determine the chosen path for a signal communicated between programmed logic blocks through such routing structures. Such dispersal of switching devices usually requires numerous diffusion areas within the integrated circuit device, which use a large amount of silicon surface area. To minimize cost, surface area must be used efficiently, particularly where a relatively large number of signal paths must be provided within a relatively small surface area. Therefore, there is a need to use a shared diffusion area which maximizes the number of paths for the diffusion area or, alternatively, minimizes the diffusion area for a given number of paths.

SUMMARY OF THE INVENTION

A structure and method are provided for designing the wiring layout or routing paths in a programmable logic integrated circuit device for maximizing the number of paths for an available diffusion area or, alternatively, for minimizing the required diffusion area for a given number of paths. The structure includes an elongated diffusion area extending along a given direction (the predominant direction) and separated by voltage-controlled transistor gates into serially arrayed adjacent diffusion regions. The method comprises the steps of: selecting four compass directions (wire directions) along the surface of the integrated circuit; selecting a first wire direction, preferably parallel to the predominant direction, for a wire connected to a first diffusion region, preferably located at one end of the diffusion area; selecting the wire direction for a second wire connected to the adjacent diffusion region to be opposite to the first wire direction; proceeding sequentially in the predominant direction along the diffusion area, selecting the third wire direction to be perpendicular to the first wire direction; and selecting the fourth wire direction to be opposite to the direction of the third wire. Thus, the method of the present invention results in the first four wire directions being along the four possible compass directions (i.e., S, N, E, W), with the wires connected to the first two diffusion regions being parallel to each other and the wires connected to the next two diffusion regions being parallel to each other and perpendicular to the first two. The direction of the last wire, connected to the last diffusion region, preferably at the opposite end of the diffusion area from the first diffusion region, may be the same as the direction of the first wire. In the preferred embodiments the last wire is connected to the first wire.

The pattern of four wire directions (for the first "set" of four wires) may be repeated along the entire length of the diffusion area. However, in a first embodiment of the inventive method, the first two wire directions are repeated in each set while the second two wire directions are alternated from set to set.

In a second embodiment, a more extensive pattern is developed. This pattern consists of a sequence wherein the first two wire directions (the first "pair") from the first set are reversed in the second set, then the second pair are reversed in the third set, the fourth set is a duplicate of the third set, the first pair are reversed again in the fifth set, and the second pair are reversed again in the sixth set.

Additional steps, such as alternating only the second pair along the first half of the diffusion area and then alternating only the first pair along the second half of the diffusion area may also be utilized. The invention also contemplates the step of regularly repeating sequences (patterns) of wire directions along the diffusion area every selected number of wires (preferably a factor of the number of possible directions i.e.,—4).

The single diffusion area of the preferred embodiments can also be divided into multiple smaller diffusion areas wherein the pattern of wires according to the invention is continued from one diffusion area to another. However, the silicon surface area required to implement the routing structure in this fashion will not be minimal, so this approach is not preferred. This approach is also encompassed by the invention.

In addition to assuring single turn connectivity for all of the wires in the routing structure (i.e., every wire can be connected to a wire going in a perpendicular wire direction and another wire going in an opposite wire direction), the present invention also results in a reduction in the number of separate diffusion areas while accommodating all wires and all directions in one elongated, area-limited diffusion area wherein total diffusion area, for a given number of connections, is reduced.

OBJECTS OF THE INVENTION

It is a principal object of the invention to provide a structure and method for laying out wire routing paths for maximum sharing of diffusion area, therefore minimizing diffusion area in a programmable logic integrated circuit device.

It is an additional object of the invention to provide a structure and method for achieving an acceptable wire routing architecture in a programmable logic integrated circuit device which is diffusion area limited.

It is still an additional object of the invention to provide a structure and method for laying out signal routing while making maximum use of available diffusion area on a programmable logic integrated circuit device.

It is still an additional object of the invention to provide an improved programmable logic integrated circuit device having an elongated unitary diffusion area shared by a plurality of routed wires for programmable interconnection thereof wherein the total diffusion area required for such routed wires is minimized by direction selection criteria at junctions along said diffusion area.

BRIEF DESCRIPTION OF THE DRAWINGS

The aforementioned objects and advantages of the present invention, as well as additional objects and advantages thereof will be more fully understood hereinafter as a result of a detailed description of the preferred embodiments when taken in conjunction with the following drawings.

DETAILED DESCRIPTION OF EMBODIMENTS OF THE INVENTION

Figure 1:
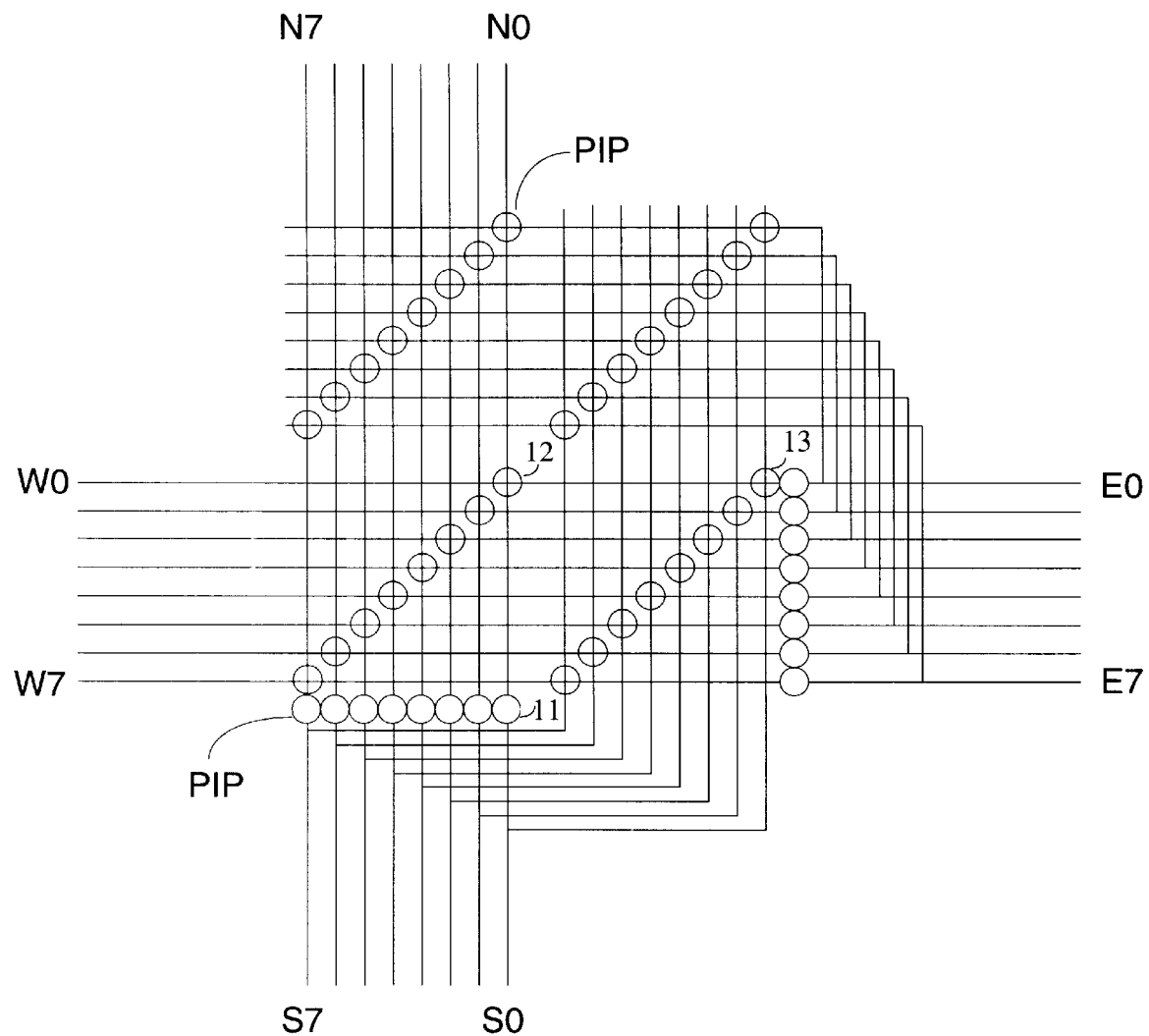
FIG. 1 is an architectural representation of a programmable routing structure of the prior art.

Referring first to prior art FIG. 1, it will be seen that in a typical routing structure within a programmable logic device, wires are identified by compass directions corresponding to their entrance or exit directions. These compass directions define the predominant directions of the wires, but the actual layout of any given wire may not be in a precise compass direction, and may include jogs or zig-zags. Additionally, the wires can be viewed as being either horizontal or vertical, with endpoints at the routing structure, in which case there are only two types of wires instead of four. However, the identification method using four compass directions was found to be most convenient for the present description. Notwithstanding this nomenclature, in the preferred embodiments each wire is bidirectional. Each wire passes through one or more programmable interconnection points (PIPs), where a signal is selectively transmitted from one wire to another by virtue of a programmed path dependent upon the status of one or more switches, as determined by the presence or absence of a voltage at a transistor gate interconnecting two diffusion regions. As previously indicated, one does not always have the surface area "luxury" of providing large numbers of dispersed diffusion areas and an expansive distribution of paths.

Referring to FIGS. 2–6, it is seen that routing in accordance with the present invention assumes four wire directions, which for the sake of clarity and convenience are deemed to be parallel to the four compass directions South (S), North (N), East (E) and West (W).

Figure 2:
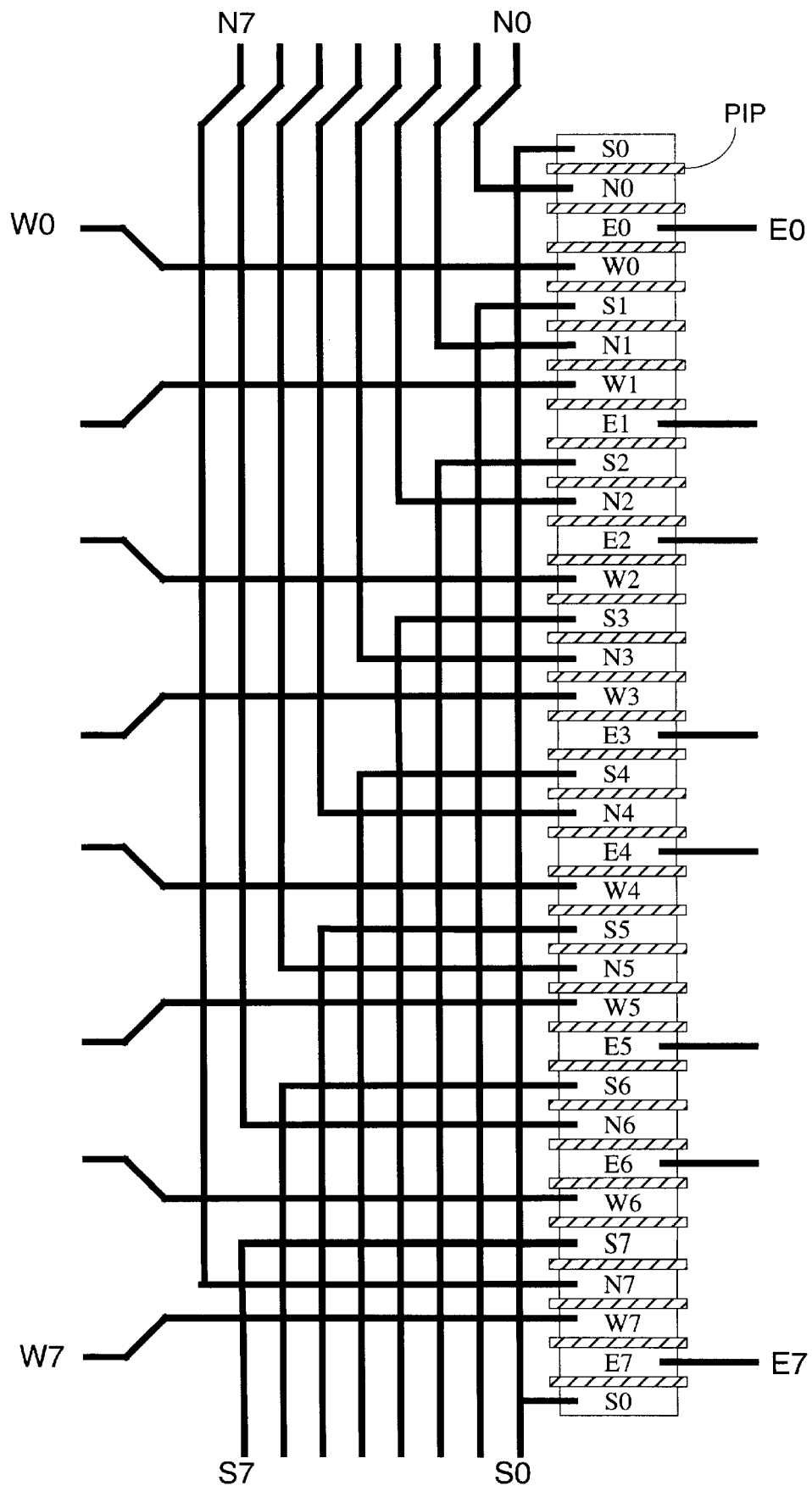
FIG. 2 illustrates the arrangement of the diffusion area and transistor gates for the first embodiment of the invention.

In FIG. 2, 32 wires are routed in accordance with the inventive method of the first embodiment. In the preferred embodiments, each wire intersects the diffusion area perpendicular to its predominant direction, and is connected thereto. Each such intersection region (diffusion region) is separated from one or two adjacent diffusion regions by programmable n-channel transistor gates, which permit selective interconnection between adjacent diffusion regions by user programming. Therefore, these transistors implement the PIPs and control the programmed signal path. (The programmable control logic for the PIPs is not shown in FIG. 2.) In accordance with the inventive method, the predominant direction of the diffusion area (North/South in FIG. 2) is first determined. Then a first wire direction (South in FIG. 2) for one end of the diffusion area (the North end in FIG. 2) is selected. In the preferred embodiments, the direction of the first wire (S0 in FIG. 2) is parallel to the predominant direction of the diffusion area (North/South in FIG. 2) so that the interconnect wire can be used to connect the two end diffusion regions. The method continues with selecting the second wire direction (N0) to be opposite (North) to the first wire direction. Then, proceeding sequentially along the diffusion area in the predominant direction, the method continues with selecting the next wire direction (third wire) to be perpendicular (East) to the first, and the next wire direction (fourth wire) to be opposite (West) to the direction of the third wire. In the first embodiment depicted in FIG. 2, in the second set of four wires the directions are alternated for the second pair of wires (W1, E1). This series of alternations between the last pair of each set of four wires proceeds along the diffusion area until the last set (i.e., S7, N7, W7, E7). The first wire (S0) is also connected to the last diffusion region (South end of the diffusion area in FIG. 2).

The repeating pattern for the first embodiment is a sequence of eight wires. For example, a typical order of wire directions along the diffusion area, as shown in FIG. 2, might be S0, N0, E0, W0, S1, N1, W1, E1; S2, N2, E2, W2, S3, N3, W3, E3 . . . . The advantage of the first embodiment is that for a group of wires entering the routing structure from one direction, each wire can always make a connection to the opposite direction through only one transistor (e.g., a West wire can always connect to an East wire), and half of the wires can connect to one of the two perpendicular directions and half to the other (e.g., half of the West wires connect to North wires, and half to South wires). This ability increases the flexibility of the routing structure. In the preferred embodiments, the last wire, connected to the last diffusion region, is connected back to the first wire, such that the repeated pattern can continue uninterrupted in a circular fashion.

Figure 3:
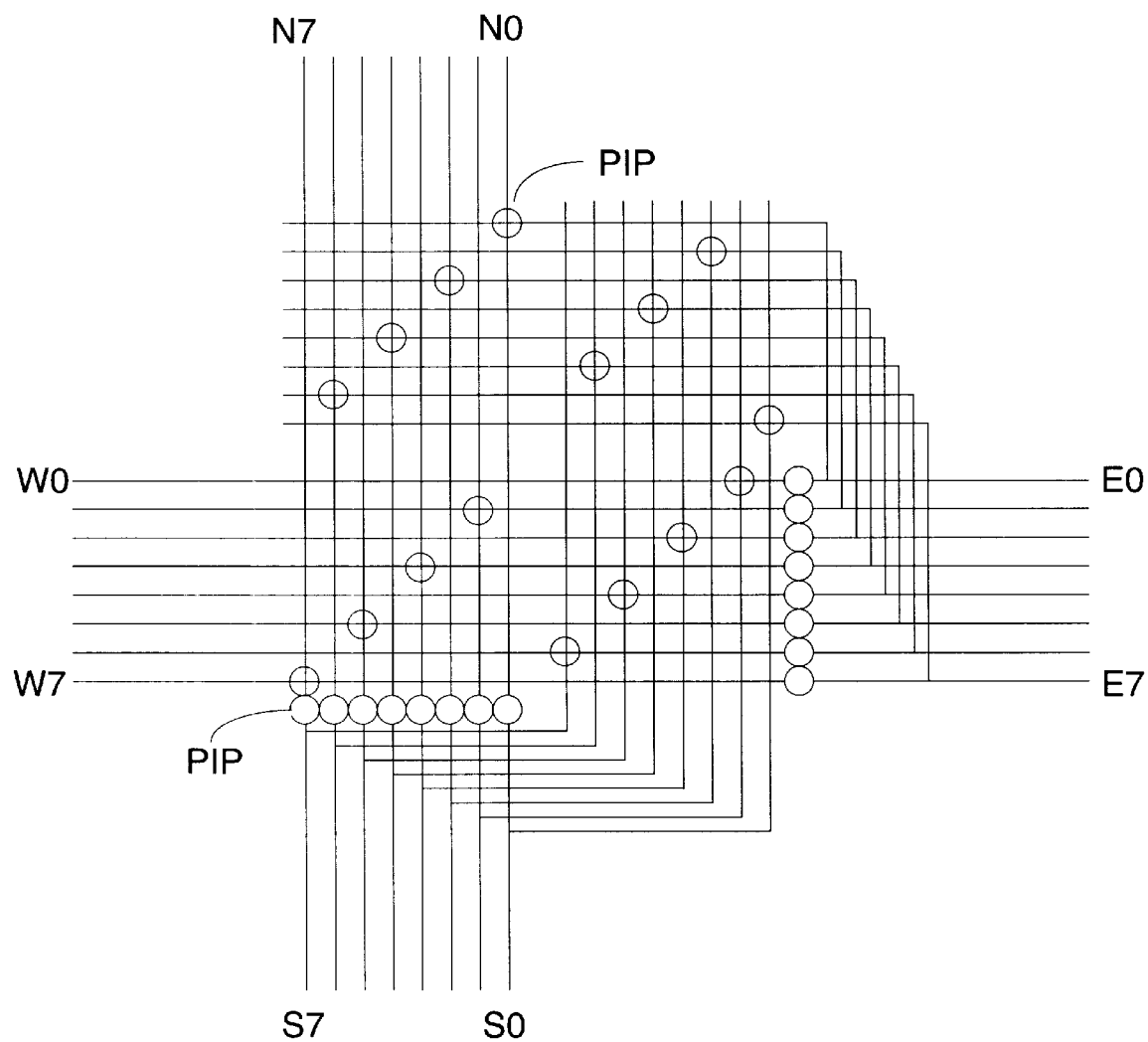
FIG. 3 is an architectural representation of a programmable routing structure with the same number of wires as FIG. 1 but utilizing the method of the invention for minimizing diffusion area. The architecture in FIG. 3 corresponds directly to the first embodiment shown in FIG. 2.

FIG. 3 shows an architectural representation of the first embodiment illustrated in FIG. 2. Comparing FIG. 3 with the prior art architecture shown in FIG. 1, it is seen that for the same number of wires, the number of PIPs is reduced by one-half. The diffusion area required to implement the architecture, however, is reduced by more than one-half, due to the inventive method used to implement the architecture in a single diffusion area. Therefore, although the number of possible interconnections (i.e., the number of PIPs) in FIG. 3 is less than in FIG. 1, the diffusion area used is reduced more than proportionately, resulting in a more efficient implementation. Additionally, the reduced capacitance for each wire resulting from the decreased amount of diffusion improves the speed of each individual wire.

Figure 4:
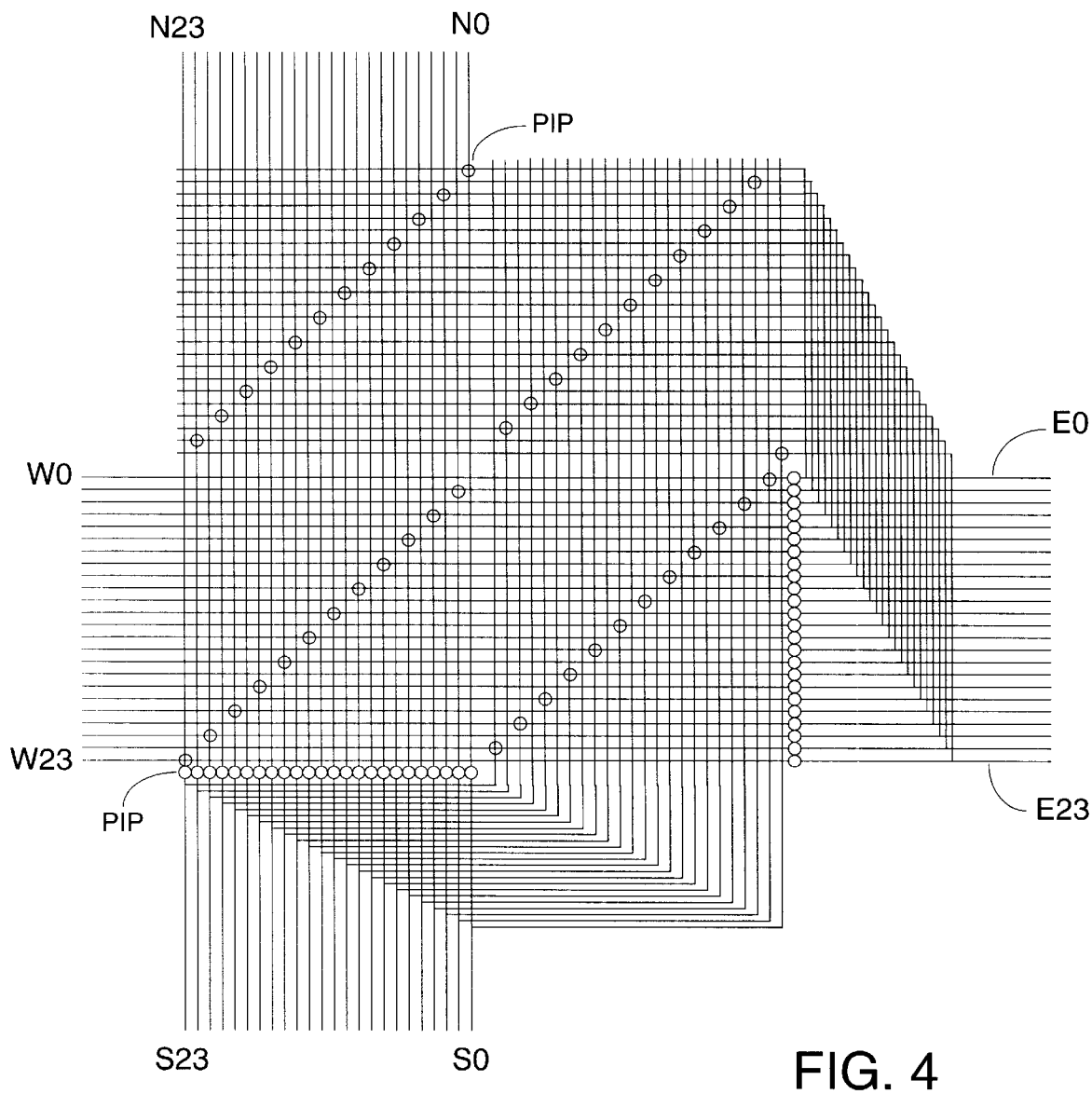
FIG. 4 is an architectural representation of a programmable routing structure similar to FIG. 3 and also according to the first embodiment of the invention, but showing a larger number of wires and signal paths.

In FIG. 4, a routing of 96 wires is shown. FIG. 4 shows the first embodiment expanded from the smaller implementation of FIGS. 2 and 3 to a larger-sized programmable routing structure.

In the first embodiment, the number of PIPs is equal to the number of wires in the routing structure. For example, the routing structure in FIG. 3 has 32 wires and 32 PIPs, while a routing structure according to the invention with 48 wires would have 48 PIPs. However, the prior art routing structure in FIG. 1 has 32 wires and 48 PIPs. The prior art structure with the same number of PIPs, i.e., the same number of transistors (48), would require more diffusion area to implement these transistors, since more than one diffusion area would be used. (Multiple diffusion areas for the same number of transistors require more diffusion periphery, therefore more area is consumed.) However, fewer wires would be available (32 instead of 48). A prior art structure with the same number of PIPs would both require more diffusion area and include a smaller number of wires.

One measure of routing efficiency is the minimum number of transistors one must go through before returning to the same wire (completing a "cycle"). The highest efficiency is achieved when a cycle includes every transistor in the programmable routing structure, as in FIG. 2 and the routing architectures of FIGS. 3 and 4. (Consider FIG. 2. To travel from S0 at the North end of the diffusion area to S0 at the South end, every transistor must be traversed.) This case provides the highest efficiency because the more transistors there are per cycle, the larger the number of possible paths starting at a given wire and having a given number of transistors therein. On the other hand, in the prior art routing architecture of FIG. 1, a cycle includes fewer transistors (three: for example, S0, N0, W0, S0 through PIPs 11, 12, 13). Thus, using this measure of efficiency, it is apparent that the architecture of FIG. 3, which employs the novel method of the invention, is more efficient than the architecture of FIG. 1.

Figure 5:
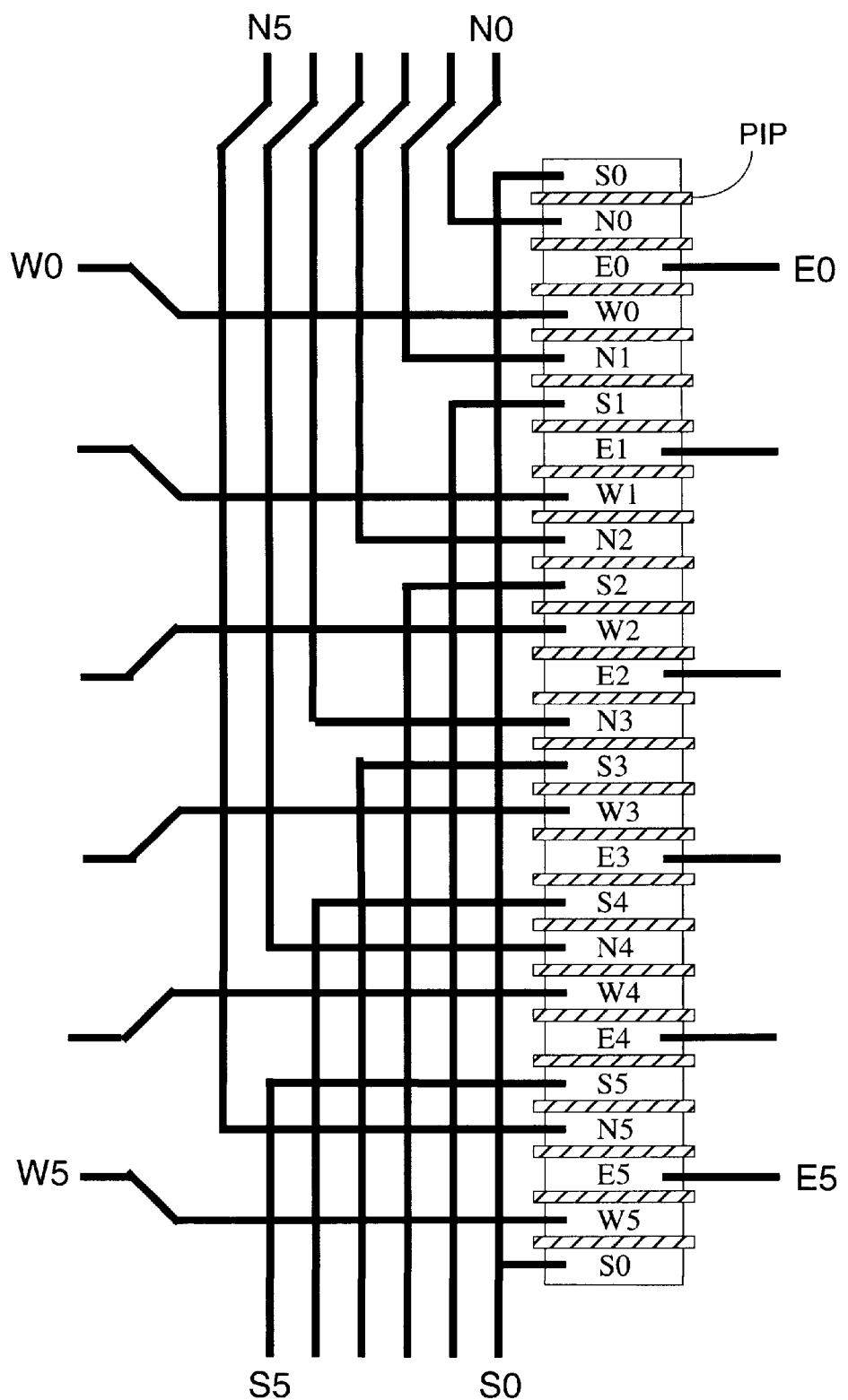
FIG. 5 illustrates the arrangement of the diffusion area and transistor gates for the second embodiment of the invention.

In FIG. 5, 24 wires are routed in accordance with the inventive method of the second embodiment. Comparing this embodiment to the first embodiment shown in FIG. 2, it is seen that a smaller number of wires is shown (24 instead of 32) and a different pattern of wire directions is used. Because of the length of the pattern (24 wires in FIG. 5 compared to 8 wires in FIG. 2), the pattern is not repeated in FIG. 5. The inventive method already described is followed and results in a pattern in which the first two wire directions (the first "pair") from the first set are reversed in the second set, then the second pair are reversed in the third set, the fourth set is a duplicate of the third set, the first pair are reversed again in the fifth set, and the second pair are reversed again in the sixth set. The first wire (S0) is also connected to the last diffusion region (South end of the diffusion area in FIG. 5).

The repeating pattern for the second embodiment is a sequence of 24 wires, for example S0, N0, E0, W0, N1, S1, E1, W1, N2, S2, W2, E2, N3, S3, W3, E3, S4, N4, W4, E4, S5, N5, E5, W5 . . . . As with the first embodiment, for a group of wires entering the routing structure from one direction, each wire can always make a connection to the opposite direction (e.g., a West wire can always connect to an East wire), and half of the wires can connect to one of the two perpendicular directions and half to the other (e.g., half of the West wires connect to North, half to South).

Figure 6:
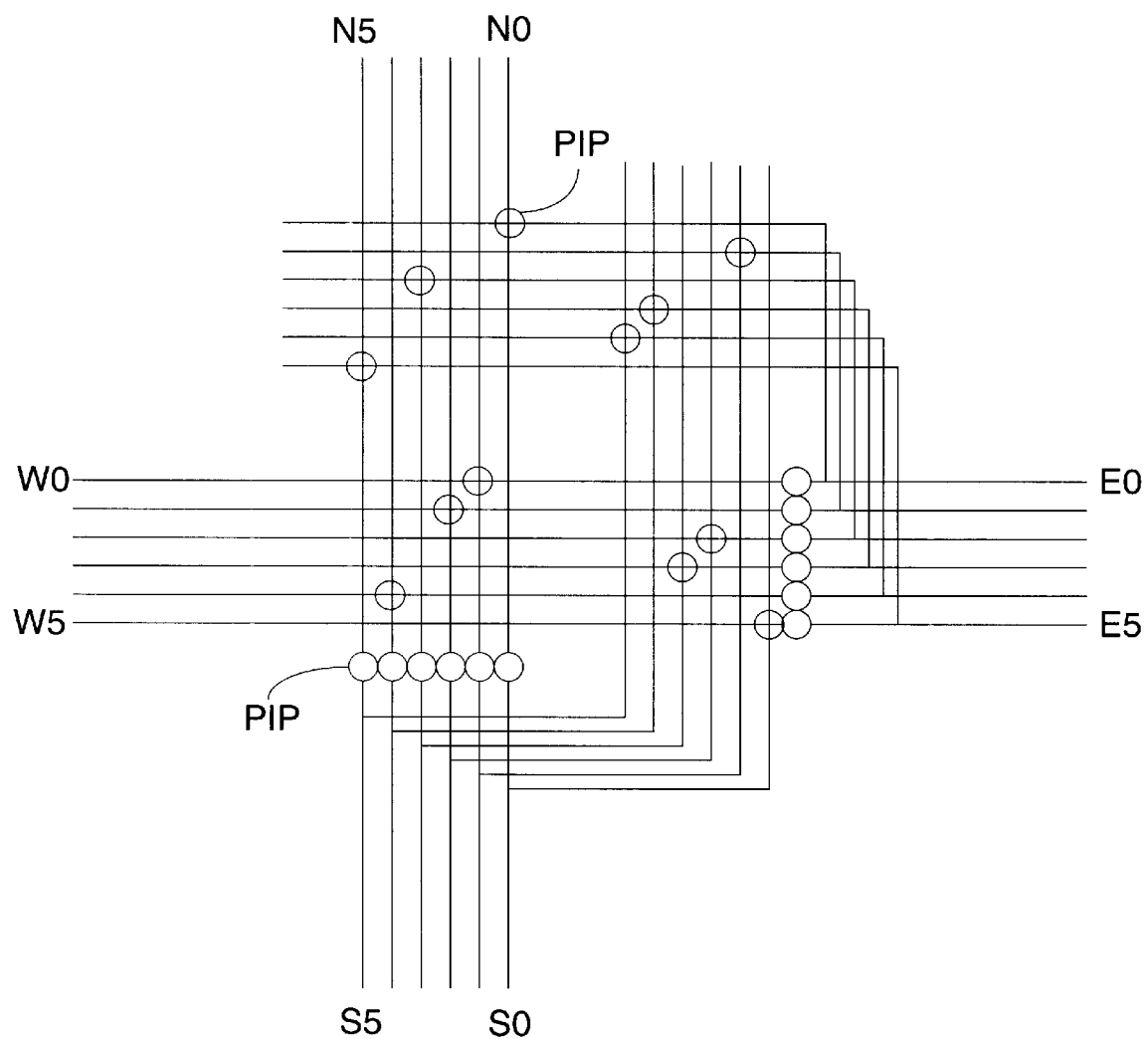
FIG. 6 is an architectural representation of a programmable routing structure utilizing the method of the invention for minimizing diffusion area. The architecture in FIG. 6 corresponds directly to the second embodiment shown in FIG. 5.

FIG. 6 shows an architectural representation of the second embodiment illustrated in FIG. 5.

Figure 7:
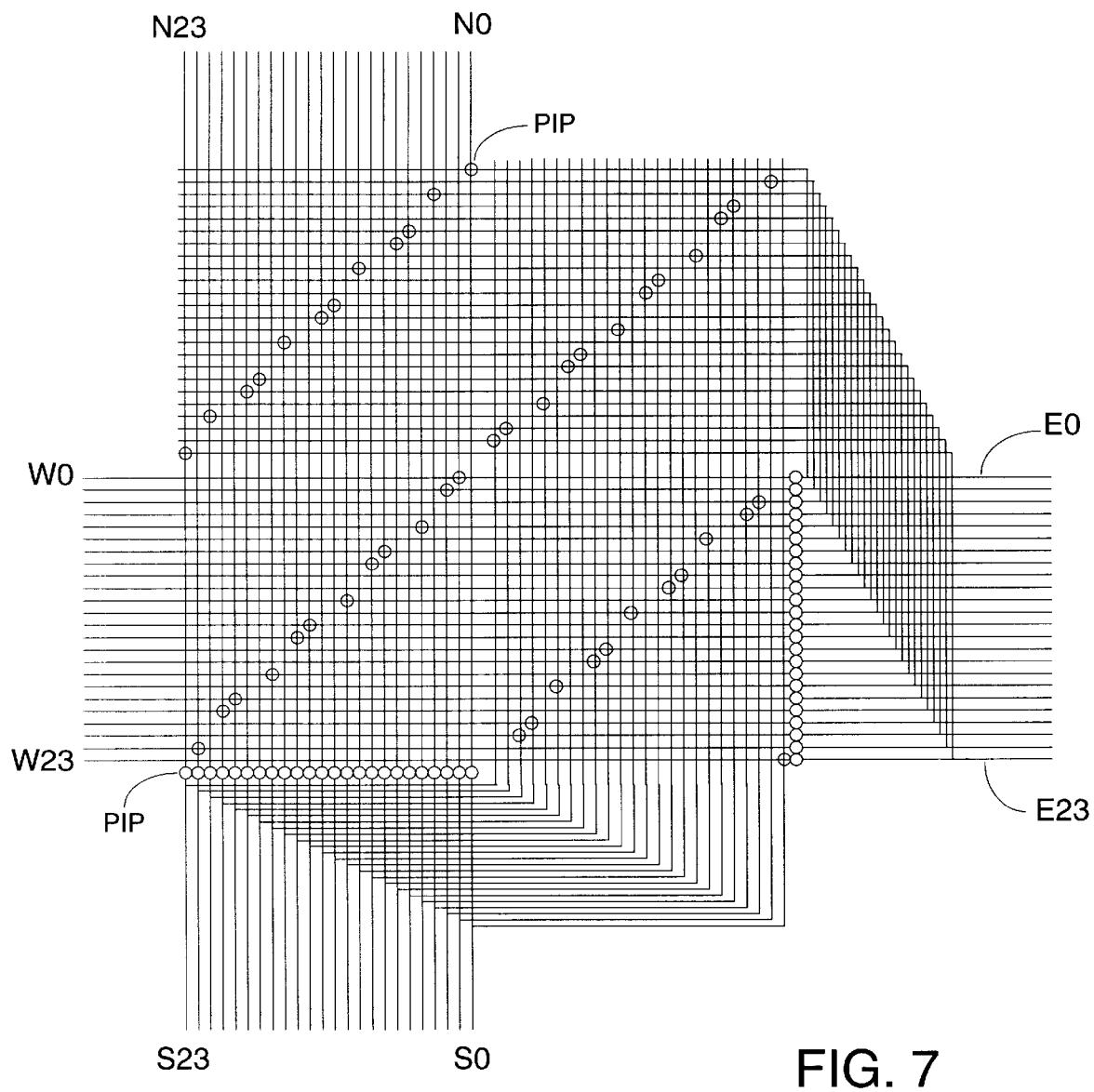
FIG. 7 is an architectural representation of a programmable routing structure similar to FIG. 6 and also according to the second embodiment of the invention, but showing a larger number of wires and signal paths.

FIG. 7 shows a routing of 96 wires. FIG. 7 shows the second embodiment expanded from the smaller implementation of FIGS. 5 and 6 to a larger-sized programmable routing structure.

Returning to the first embodiment as shown in FIG. 3, if several such routing structures are arrayed in horizontally and vertically aligned rows and columns (i.e., in a rectangular "tile" pattern), some signal paths can alternate a right and a left "turn" in a path through two turns in two different tiles. This ability increases the routability of a path having a destination diagonally removed from the origin. Note that in the repetitive pattern of the first embodiment, detailed above and shown in FIG. 2, the South/North pairs are always surrounded by the "same" direction (i.e., WSNW or ESNE) while the East/West pairs are always surrounded by "opposite" directions (i.e., NEWS, NWES). Therefore, the East and West wires have more flexibility than the North and South wires, because they have more turning options. For example, suppose a path is needed from the Northwest to the Southeast. Bearing in mind that the names of the wires change as a path moves from tile to tile (e.g., a wire labeled E0 in a given tile is labeled W0 in the rightward adjacent tile), possible routing patterns include N0 to E0 (left turn), W0 to S1 (right turn). However, the only way the N1 wire can turn is right (back to the West) unless it is routed through two transistors, i.e. from N1 through W1 to E1. Routing through two transistors is a viable alternative, but introduces additional delay and uses up an additional wire (W1) in addition to N1 and E1. Therefore, the maximum number of alternating turns for the path, using only single-transistor turns, is two. Alternatively, if the Northwest to Southeast path enters the first tile on the W0 wire instead of the N0 wire, a possible routing pattern is W0 to S1 (right turn). In the next tile, the N1 wire cannot make a left turn onto an East wire without going through two transistors (N1 through W1 to E1). Therefore, there can be no alternating turns for this path. This path is less flexible than the path which began at the N0 wire.

The second embodiment has an advantage over the first embodiment. If several routing structures according to the second embodiment are arrayed in a rectangular tile pattern, some signal paths can alternate right and left turns in a path through three turns in three different tiles. Therefore, some paths can be routed through up to three turns in a zigzag pattern, which increases the routability of a path having a destination diagonally removed from the origin, even further than in the first embodiment. Note that in the repetitive pattern of the second embodiment, detailed above and shown in FIG. 5, two-thirds of the South/North pairs are surrounded by "opposite" directions (i.e., WSNE, WNSE, ENSW, or ESNW) and one-third by the "same" direction (WNSW or ESNE). The pattern is two pairs of South/North wires surrounded by "opposites" followed by one set surrounded by "sames". Similarly, two-thirds of the East/West pairs are surrounded by "opposite" directions (i.e., SEWN, SWEN, NWES, or NEWS) and one-third by the "same" direction (NEWN or SWES). Therefore, the East and West wires, as a group, have the same flexibility as the North and South wires, and the overall structure is more flexible than the first embodiment. For example, suppose a path is needed from the Northwest to the Southeast. Bearing in mind that the names of the wires change as a path moves from tile to tile (e.g., a wire labeled E5 in a given tile is labeled W5 in the rightward adjacent tile), possible routing patterns include N5 to E5 (left turn), W5 to S0 (right turn), N0 to E0 (left turn). However, the only way the W0 wire can turn is left (back to the North) unless it is routed through two transistors, i.e. through N1 to S1. Therefore, the maximum number of alternating turns for the path, using only single-transistor turns, is three. This path is more flexible than any of the paths available in the first embodiment. However, since the repetitive pattern is longer, the second embodiment may be unsuitable where the available diffusion area is very small.

The concept of creating patterns of paired wires surrounded by "sames" and "opposites", shown in the second embodiment, can be extended to patterns with three "opposites" followed by one "same", and so forth. Other patterns of "sames" and "opposites" will be obvious to those of ordinary skill in the art based on this description. These patterns are within the scope of the present invention.

Thus it will be understood that the present invention provides a novel method for designing the architecture of wire routing in a programmable logic device or portion thereof. More specifically, the method comprises steps for selecting wire directions for a plurality of wires interconnectible at a unitary diffusion area of an integrated circuit device or portion thereof. The steps of the inventive method result in a highly alternated array of wire directions including serial sets of four wires extending in four compass directions. The array provides maximum shared diffusion area for the number of wires.

Those having skill in the relevant arts of the invention will now perceive various modifications and additions which may be made as a result of the disclosure herein of preferred embodiments. Accordingly, all such modifications and additions are deemed to be within the scope of the invention, which is to be limited only by the appended claims and their equivalents.

I claim:

1. An integrated circuit device comprising:

a routing structure; and a plurality of wires extending from said routing structure in each of a plurality of compass directions, each of said plurality of wires having an assigned direction based on the compass direction in which it extends from said routing structure, said routing structure comprising an elongated diffusion area having a plurality of serially arrayed diffusion regions, one of said diffusion regions being connected to each respective wire of said plurality of wires, each such region being selectively connectable to at least one adjacent diffusion region by a voltage-controlled transistor gate for transmitting a signal on one said wire having a first direction to another said wire having a second direction; and the respective directions of said wires conforming to a serial pattern wherein each such wire has a direction which is perpendicular to the direction of one wire connected to one adjacent diffusion region and opposite to the direction of another wire connected to another adjacent diffusion region.

2. An integrated circuit device having a plurality of programmable wire interconnections among a plurality of wires forming a plurality of routing structures, each wire having a direction based upon its input or output location within one of said routing structures, comprising:

an elongated diffusion area having a plurality of serially arrayed diffusion regions, one of said diffusion regions being connected to each respective wire of said plurality of wires, each such region being selectively connectable to at least one adjacent diffusion region by a voltage-controlled transistor gate for transmitting a signal on one said wire having a first direction to another said wire having a second direction;

the respective directions of said wires conforming to a serial pattern wherein each such wire has a direction which is perpendicular to the direction of one wire connected to one adjacent diffusion region and opposite to the direction of another wire connected to another adjacent diffusion region, wherein said pattern comprises sets of four adjacent wires and wherein the sequence of wire directions within each such set is different from the sequence of wire directions in immediately adjacent sets.

3. A programmable routing structure, comprising:

an elongated diffusion area;

a plurality of programmable gates dividing said elongated diffusion area into a plurality of serially arrayed diffusion regions; and for each of said diffusion regions a wire connected to said region and extending in one of four compass directions, adjacent ones of said diffusion regions being connected to wires extending in different directions;

wherein said diffusion regions are grouped into sets of four adjacent regions and the four regions of one such set are connected to wires extending in four different directions.

4. A programmable routing structure, comprising:

an elongated diffusion area;

a plurality of programmable transistor gates dividing said elongated diffusion area into a plurality of serially arrayed diffusion regions such that adjacent ones of said diffusion regions are programmably connected by said transistor gates; and for each of said diffusion regions a wire connected to said diffusion region and extending in one of four compass directions, adjacent ones of said diffusion regions being connected to wires extending in different directions;

wherein each diffusion region:

is connected to a wire extending in a first direction;

is programmably connected to one adjacent diffusion region connected to a wire extending in the opposite direction to said first direction; and is programmably connected to another adjacent diffusion region connected to a wire extending perpendicular to said first direction.

* * * * *